US012088211B2

(12) United States Patent
Houda et al.

(10) Patent No.: US 12,088,211 B2
(45) Date of Patent: Sep. 10, 2024

(54) POWER CONVERSION DEVICE

(71) Applicant: HITACHI ASTEMO, LTD., Hitachinaka (JP)

(72) Inventors: Isao Houda, Tokyo (JP); Hiroki Funato, Tokyo (JP); Yuta Numakura, Hitachinaka (JP); Yoichiro Furuta, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 429 days.

(21) Appl. No.: 17/622,565

(22) PCT Filed: Apr. 20, 2020

(86) PCT No.: PCT/JP2020/017113
§ 371 (c)(1),
(2) Date: Dec. 23, 2021

(87) PCT Pub. No.: WO2021/005866
PCT Pub. Date: Jan. 14, 2021

(65) Prior Publication Data
US 2022/0271683 A1    Aug. 25, 2022

(30) Foreign Application Priority Data

Jul. 5, 2019    (JP) .................................. 2019-125886

(51) Int. Cl.
H05K 7/14       (2006.01)
H02M 7/00       (2006.01)
H02M 7/48       (2007.01)

(52) U.S. Cl.
CPC .......... H02M 7/003 (2013.01); H05K 7/1427 (2013.01); H02M 7/48 (2013.01)

(58) Field of Classification Search
CPC ....... H05K 7/1427; H02M 7/48; H02M 7/003
See application file for complete search history.

(56) References Cited

U.S. PATENT DOCUMENTS

2017/0194872 A1    7/2017   Fukumasu et al.
2017/0354047 A1*   12/2017  Okura ................. H05K 5/0247

FOREIGN PATENT DOCUMENTS

JP    2006-050685 A    2/2006
JP    2010-183763 A    8/2010
(Continued)

OTHER PUBLICATIONS

International Search Report with English translation and Written Opinion issued in corresponding application No. PCT/JP2020/017113 dated Jul. 21, 2020.

*Primary Examiner* — Abhishek M Rathod
(74) *Attorney, Agent, or Firm* — Foley & Lardner LLP

(57) ABSTRACT

A power conversion device including: a circuit board including a first ground constituting a ground of a first circuit and a second ground formed to be electrically separated from the first ground; a second circuit in which a joining portion is formed; a metal base plate provided between the second circuit and the circuit board and provided with an opening portion corresponding to the joining portion; and a housing that stores the circuit board, the second circuit, and the metal base plate and is electrically connected to the second ground of the circuit board and the metal base plate, in which the joining portion of the second circuit is disposed corresponding to the second ground via the opening portion of the metal base plate.

9 Claims, 9 Drawing Sheets

(56) References Cited

FOREIGN PATENT DOCUMENTS

| JP | 2017-017881 A | 1/2017 |
|---|---|---|
| WO | WO-2016/017311 A1 | 2/2016 |

\* cited by examiner

POWER CONVERSION DEVICE

TECHNICAL FIELD

The present invention relates to a power conversion device.

BACKGROUND ART

A power conversion device is known in which a storage chamber of a high-voltage main circuit including a switching element and a storage chamber of a control circuit that generates a control signal for driving the switching element are divided into two by a metal base plate in a housing.

PTL 1 describes a power converter in which to reduce noise, the inner space of a metal housing is divided into two spaces by a metal base plate, and a control circuit is mounted in one of the divided spaces, while a driver circuit and a power module are mounted in the other space.

CITATION LIST

Patent Literature

PTL 1: JP 2010-183763 A

SUMMARY OF INVENTION

Technical Problem

When the power conversion device is downsized, the internal space is narrowed, and it is necessary to provide an opening portion in a metal base plate so as to avoid a joining portion of the circuit, but there is a problem that noise propagating through this opening portion is affected.

Solution to Problem

A power conversion device according to an embodiment of the present invention includes: a circuit board including a first ground constituting a ground of a first circuit and a second ground formed to be electrically separated from the first ground; a second circuit in which a joining portion is formed; a metal base plate provided between the second circuit and the circuit board and provided with an opening portion corresponding to the joining portion; and a housing that stores the circuit board, the second circuit, and the metal base plate and is electrically connected to the second ground of the circuit board and the metal base plate, in which the joining portion of the second circuit is preferably disposed corresponding to the second ground via the opening portion of the metal base plate.

Advantageous Effects of Invention

According to the present invention, the influence of noise propagating through the opening portion of the metal base plate can be suppressed.

Problems, configurations, and effects other than those described above will be made clear by the description of the following embodiments.

DESCRIPTION OF EMBODIMENTS

Figure 1:
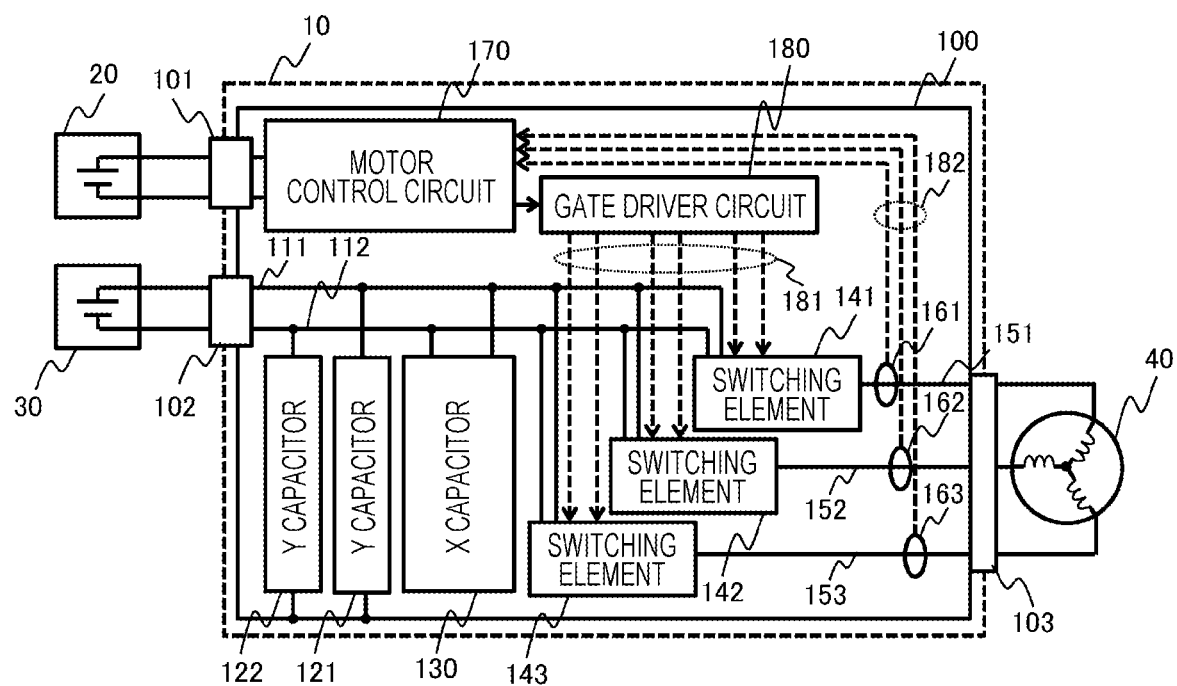
FIG. 1 is a circuit configuration view illustrating a configuration of a power conversion device and a configuration of a motor drive system to which the power conversion device is applied.

Embodiments of the present invention will be described below with reference to the drawings. Each embodiment is an example for explaining the present invention, and is omitted or simplified as appropriate for a clearer explanation. The present invention can also be carried out in various other forms. Unless otherwise specified, each component may be singular or plural.

For the purpose of facilitating understanding of the invention, the position, size, shape, range, and the like, of each component illustrated in the drawings do not necessarily represent the actual position, size, shape, range, and the like. Therefore, the present invention is not necessarily limited to the position, size, shape, range, and the like, disclosed in the drawings.

First Embodiment

The first embodiment of the present invention will be described below with reference to FIGS. 1 to 4.

FIG. 1 is a circuit configuration view illustrating the configuration of a power conversion device 10 according to the present embodiment and the configuration of a motor drive system to which the power conversion device 10 is applied. The motor drive system illustrated in FIG. 1 is an example in which direct-current voltage is converted into an alternating-current voltage in order to drive a motor of an electric vehicle, a hybrid vehicle, or the like.

In FIG. 1, the power conversion device 10 is stored in a metal housing 100. Low-voltage direct-current power, e.g., 9 to 14 V, for driving a motor control circuit 170 of the power conversion device 10 is supplied from a low-voltage power supply 20 via a low-voltage connector 101. High-voltage direct-current power, e.g., 320 to 900 V, is supplied from a high-voltage power supply 30 to the power conversion device 10 via a high-voltage connector 102. Various circuit blocks and elements are stored in the housing 100 of this power conversion device 10, and only those necessary for description are illustrated in FIG. 1 among those circuit blocks and elements. FIG. illustrates a motor 40 driven by an alternating-current voltage generated by the power conversion device 10.

As the high-voltage power supply 30, a battery or one obtained by converting an alternating-current power supply into a direct-current voltage by a converter is generally used. For example, a driving inverter of a hybrid vehicle uses a high-voltage battery of several hundred volts as the high-voltage power supply 30. For example, since a medical device such as an X-ray diagnostic device uses a commercial alternating-current power supply, it is converted into a direct-current high-voltage power supply 30 using a rectifier circuit or a converter.

Although not particularly limited, the motor 40 is configured by a three-phase electric motor. This motor 40 includes a rotor (not illustrated) and a stator (not illustrated), and has three coils arranged in the stator. The power conversion device 10 forms a three-phase alternating-current voltage and supplies the alternating-current voltage to the three coils to generate a magnetic field according to the three-phase alternating-current voltage and rotate the rotor.

Next, the configuration of the power conversion device 10 will be described. The power conversion device 10 includes, in the housing 100, the low-voltage connector 101, the high-voltage connector 102, a motor harness connector 103, an anode busbar 111, a cathode busbar 112, an anode Y capacitor 121, a cathode Y capacitor 122, an anode-cathode X capacitor 130, switching elements 141 to 143, AC busbars 151 to 153, current sensors 161 to 163, a motor control circuit 170, and a gate driver circuit 180.

Here, as described above, the high-voltage direct-current power supplied from the high-voltage power supply 30 is supplied to the switching elements 141 to 143 by the anode busbar 111 and the cathode busbar 112. Since the switching elements 141 to 143 generate a radio frequency switching current and voltage at the time of switching, the X capacitor 130 for smoothing this is generally used. Although not illustrated in FIG. 1, a plurality of capacitors having a capacitance of about several tens of microfarads are connected in parallel. Here, an anode-side terminal of the X capacitor 130 is connected to the anode busbar 111, and a cathode-side terminal of the X capacitor 130 is connected to the cathode busbar 112. Although not particularly limited, these anode busbar 111 and cathode busbar 112 are copper plates made of copper. The capacitor 121 is connected between the anode busbar 111 and the housing 100, and the Y capacitor 122 is connected between the cathode busbar 112 and the housing 100, thereby reducing common mode noise superimposed on the anode busbar 111 and the cathode busbar 112.

As the switching elements 141 to 143, semiconductor elements such as IGBTs, MOSFETs, and SiCs are generally used, and a desired voltage and current are generated by switching (switching between on and off) these semiconductor elements. Switching outputs of the switching elements 141 to 143 are connected from the AC busbars 151 to 153, respectively, to the motor 40 via the motor harness connector 103. The current sensors 161 to 163 are attached to the AC busbars 151 to 153, respectively, and a current value flowing through each AC busbars 151 to 153 is supplied to the motor control circuit 170 as an AC current monitor signal 182.

Upon receiving the AC current monitor signal 182, the motor control circuit 170 generates a PWM signal and supplies the PWM signal to the gate driver circuit 180. The gate driver circuit 180 inputs a gate drive signal 181 to gate terminals of the switching elements 141 to 143 to operate the switching elements 141 to 143.

In the thus configured power conversion device 10, the switching elements 141 to 143 are switched by the gate drive signal 181 from the gate driver circuit 180, and the anode voltage and the cathode voltage are periodically output from the AC busbars 151 to 153, so that the switching elements 141 to 143 are periodically turned on/off. Therefore, the voltage/current in the anode busbar 111 and the cathode busbar 112 changes, and noise is generated.

Figure 2:
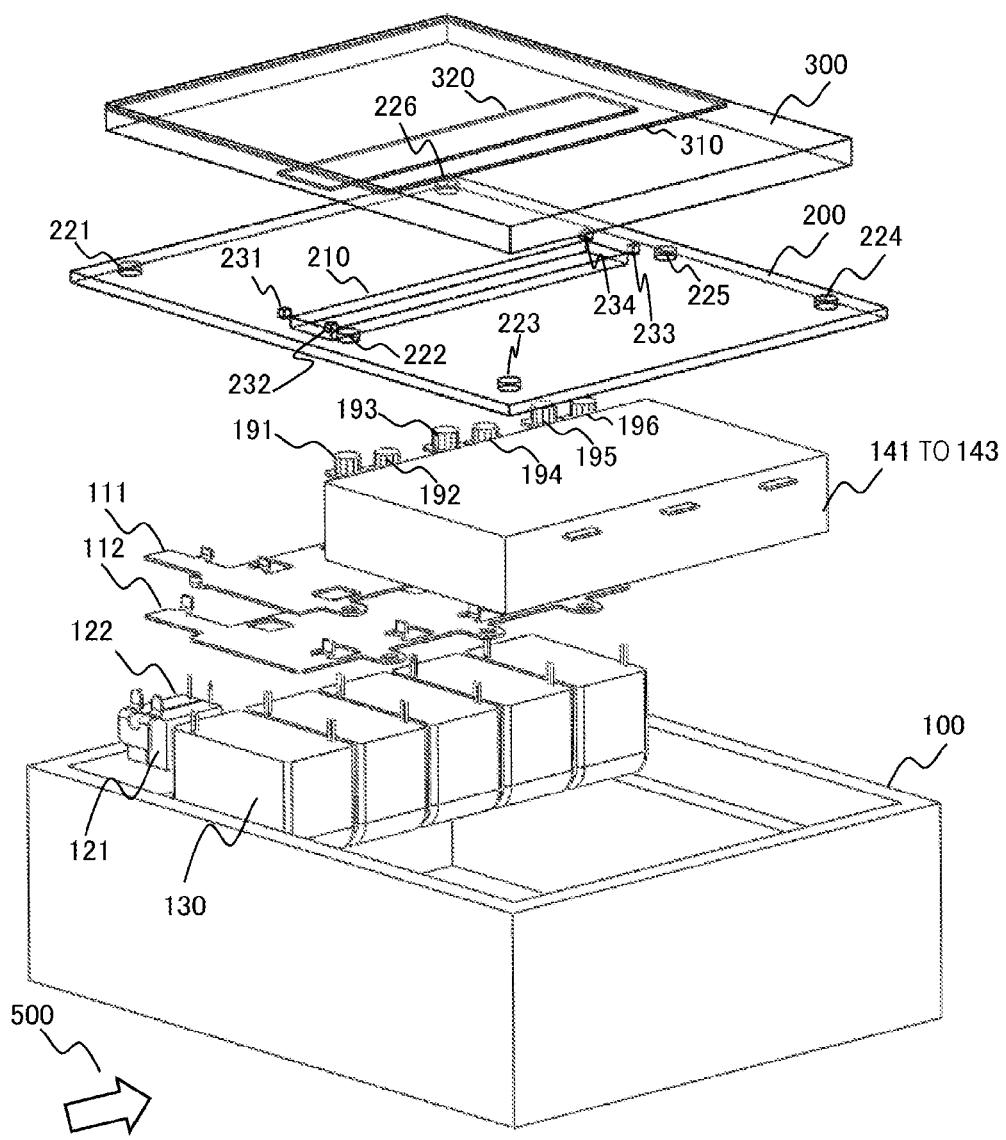
FIG. 2 is an exploded perspective view illustrating an example of a structure of a power conversion device according to a first embodiment.
Figure 3:
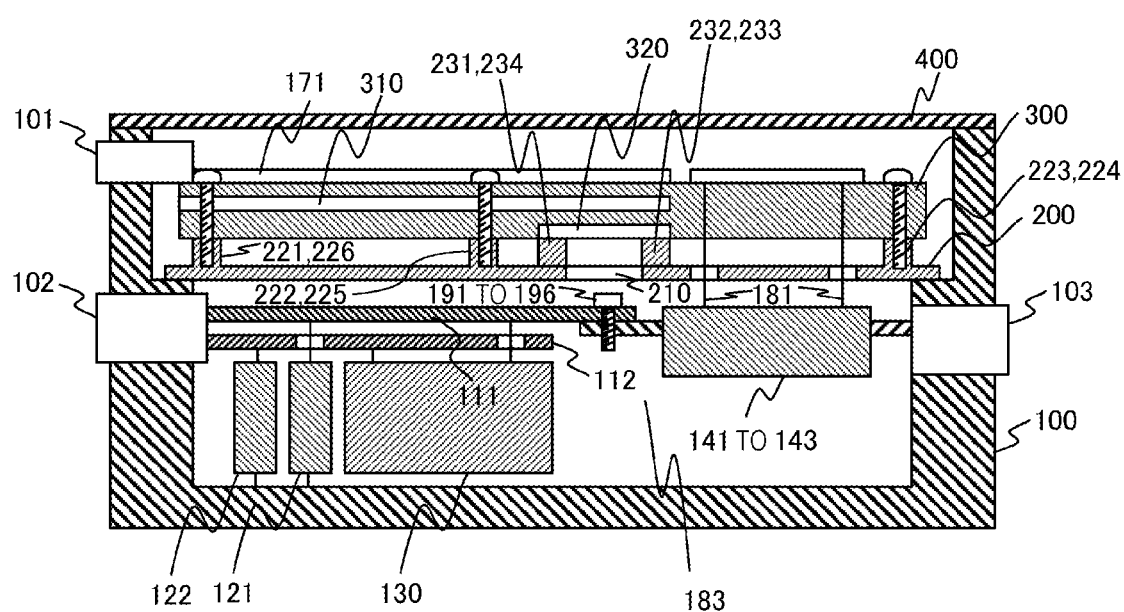
FIG. 3 is a cross-sectional projection view illustrating an example of a structure of the power conversion device according to the first embodiment.
Figure 4:
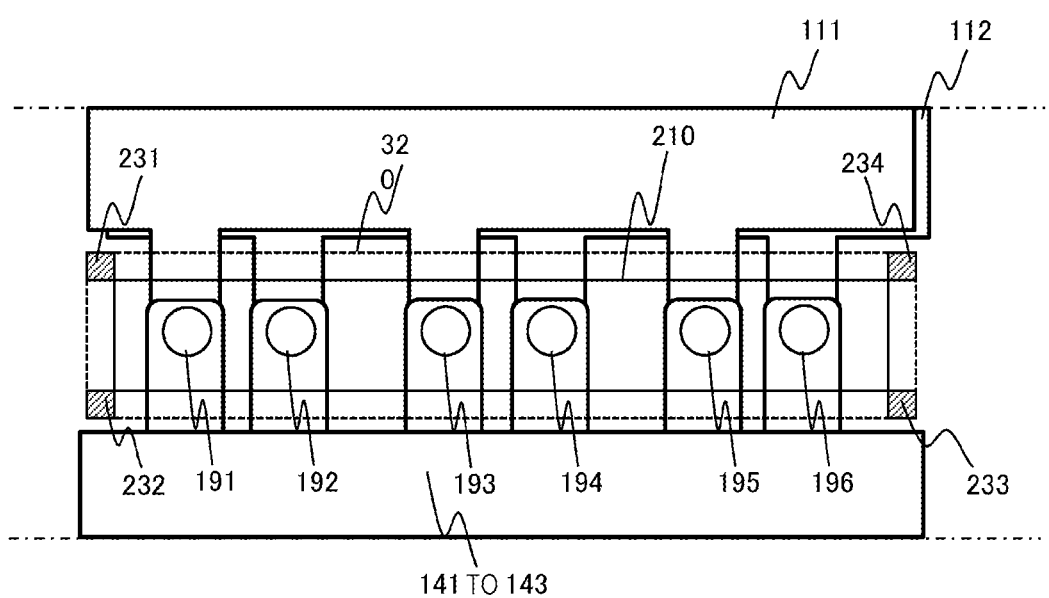
FIG. 4 is a top view illustrating an example of a periphery of an opening portion of a metal base plate of the power conversion device according to the first embodiment.

FIGS. 2 to 4 are views illustrating examples of the structure of the power conversion device 10.

FIG. 2 is an exploded perspective view illustrating an example of the structure of the power conversion device 10 according to the present embodiment. In the figure, when the power conversion device 10 is developed, the Y capacitors 121 and 122, the X capacitor 130, and the switching elements 141 to 143 are stored in a bottom portion of a box-shaped housing 100 from which a lid is removed. The anode busbar 111 and the cathode busbar 112 are stacked apart from each other, and are connected to terminals of the Y capacitors 121 and 122 and the X capacitor 130. The anode busbar 111 and the cathode busbar 112, which are high-voltage portions, are connected to input terminals of the switching elements 141 to 143, which are high-voltage portions, by joining screws 191 to 196. The joining screws 191 to 196 are joining portions for electrically connecting the anode busbar 111 and the cathode busbar 112 with the switching elements 141 to 143. In FIG. 2, all the joining screws cannot be illustrated due to the characteristics of the exploded view, but joining is performed at six parts at six connection parts of the anode busbar 111 and the cathode busbar 112 with the switching elements 141 to 143 in FIG. 1. A circuit including the anode busbar 111, the cathode busbar 112, the joining screws (joining portions) 191 to 196, and the switching elements 141 to 143 is referred to as a second circuit.

The metal base plate 200 is located above the second circuit, which is a high-voltage portion, in order to prevent the high-frequency noise generated by the switching operation of the switching elements 141 to 143, which are high-voltage portions, from propagating to the motor control circuit 170, which is a low-voltage portion, in the power conversion device 10. A circuit board 300 on which the motor control circuit 170 and the like are disposed is located above the metal base plate 200.

The motor control circuit 170 and the gate driver circuit 180 that are illustrated in FIG. 1, a first board GND pattern 310, and a second board GND pattern 320 are arranged on the circuit board 300. The first board GND pattern 310 and the second board GND pattern 320 are not electrically connected to each other on the circuit board 300. Here, the motor control circuit 170 is a circuit that operates with a low-voltage source supplied from the low-voltage power supply 20, and uses the first board GND pattern 310 as a reference GND. The motor control circuit 170 on the circuit board 300 is referred to as a first circuit.

On the other hand, the gate driver circuit 180 is a circuit connected to the switching elements 141 to 143, which are high-voltage portions, and belongs to the high-voltage portion, and therefore the first board GND pattern 310 is not used as a reference.

The metal base plate 200 has an opening portion 210 for avoiding contact with the joining screws 191 to 196, and noise propagates to the low-voltage portion via this opening portion 210. Four corners of this opening portion 210 are provided with bosses (second board GND pattern connection bosses 231 to 234) for electrically connecting with the circuit board 300 located further above the metal base plate 200, and are electrically connected with the second board GND pattern 320 of the circuit board 300. This electrical connection method is assumed to be, for example, a method of directly bringing the second board GND pattern connection bosses 231 to 234 into contact without applying a protective film to the second board GND pattern 320, a method of sandwiching a gasket, a method of bringing into contact using a spring, a method of screwing, and the like, but the method is not limited in the present embodiment.

The metal base plate 200 includes board fixing bosses 221 to 226 for fixing the circuit board 300, and the metal base plate 200 and the first board GND pattern 310 of the circuit board 300 are connected by the board fixing bosses 221, 222, 225, and 226.

FIG. 3 is a cross-sectional projection view illustrating an example of the structure of the power conversion device 10 according to the present embodiment. The figure is a cross-sectional projection view when viewed from an arrow 500 illustrated in FIG. 2, which is a view of not a certain straight plane but a projection of a depth direction in order to explain the structure of the power conversion device 10. In the figure, the low-voltage connector 101, the high-voltage connector 102, the motor harness connector 103, the anode busbar 111, the cathode busbar 112, the Y capacitors 121 and 122, the switching elements 141 to 143, the gate drive signal 181, the joining screws 191 to 196, the metal base plate 200, the opening portion 210, the board fixing bosses 221 to 226, the second board GND pattern connection bosses 231 to 234, the circuit board 300, the first board GND pattern 310, and the second board GND pattern 320 are as already described in FIGS. 1 and 2, and the explanations thereof will be omitted. A mounting region 171 of the first circuit on the circuit board 300 in FIG. 3 is a region on which the low-voltage circuit is mounted centering on the motor control circuit 170 as described above, and a mounting region 183 of the second circuit is a region on which the high-voltage circuit is mounted centering on the circuit including the anode busbar 111, the cathode busbar 112, the joining screws (joining portions) 191 to 196, and the switching elements 141 to 143 as described above.

The metal base plate 200 is provided between the second circuit and the circuit board 300, and the opening portion 210 is provided corresponding to the joining screws (joining portions) 191 to 196. The housing 100 stores the circuit board 300, the second circuit, and the metal base plate 200, and is electrically connected to the second board GND pattern 320 of the circuit board 300 and the metal base plate 200. The joining portion of the second circuit is disposed corresponding to the second board GND pattern 320 via the opening portion 210 of the metal base plate 200. Note that "disposed corresponding" means that the joining portion of the second circuit and the second board GND pattern 320 are in a positional relationship corresponding to each other, and the opening portion 210 of the metal base plate 200 is located therebetween. Note that "disposed corresponding" includes a form in which the joining portion of the second circuit and the second board GND pattern 320 are disposed to face each other, and the opening portion 210 of the metal base plate 200 is located therebetween. Note that "disposed corresponding" includes a form in which the joining portion of the second circuit, a region where the metal base plate 200 is not present, e.g., the opening portion 210, and the second board GND pattern 320 are located so as to at least partially overlap one another when viewed from a direction perpendicular to an implementation surface of the circuit board 300. A metal lid 400 forms a part of the housing 100 in the power conversion device 10.

Here, the structure of the periphery of the opening portion 210 of the metal base plate 200 will be described in more detail with reference to FIG. 3. One of the performance indices for the power conversion device 10 is the housing size, and the restriction conditions in the height direction have also become strict. In such a case, the metal base plate 200 needs to be disposed apart from, at a minimum distance necessary for insulation, the high-voltage portion, which is the second circuit including the anode busbar 111, the cathode busbar 112, and the switching elements 141 to 143. In such a case, in the mounting region 183 of the second circuit, the opening portion 210 as illustrated in FIG. 3 is provided in the metal base plate 200, in order to secure the insulation distance from the metal base plate 200 while avoiding the height of the screw heads of the joining screws 191 to 196 joining the anode busbar 111 and the cathode busbar 112 with the switching elements 141 to 143, in other words, because a volume for the joining portion is required. The second board GND pattern connection bosses 231 to 234 may be located at an end of the opening portion 210, or may be located away from the end of the opening portion 210 by about 10 mm, for example.

FIG. 4 is a top view illustrating an example of the periphery of the opening portion 210 of the metal base plate 200 of the power conversion device 10 according to the present embodiment. In the figure, the anode busbar 111, the cathode busbar 112, the Y capacitors 121 and 122, the switching elements 141 to 143, the joining screws 191 to 196, the opening portion 210, the second board GND pattern connection bosses 231 to 234, and the second board GND pattern 320 are as described with reference to FIGS. to 3, and the explanation thereof will be omitted.

The positional relationship among the opening portion 210 of the metal base plate 200, the second board GND 320 of the circuit board 300, and the second board GND pattern connection bosses 231 to 234 will be described in more detail with reference to FIG. 4. First, the opening portion 210 of the metal base plate 200 is for maintaining the insulation distance from the joining screws 191 to 196, and the size of the opening portion 210 is determined according to the insulation distance. The second board GND pattern connection bosses 231 to 234 are disposed so as to be in contact with the outside of the four corners of the opening portion 210 of the metal base plate 200, and the second board GND pattern 320 is disposed at the equal position and with the equal size to those of a rectangle formed by the second board GND pattern connection bosses 231 to 234. The second board GND pattern 320 is connected to the metal base plate 200 via a connection member such as the second board GND pattern connection bosses 231 to 234, and the metal base plate 200 is connected to the housing 100.

In the power conversion device 10 according to the present embodiment, the second board GND pattern 320 is provided to be wider than the size of the opening portion 210 with respect to the opening portion 210 provided in the metal base plate 200, thereby forming the second board GND pattern 320 configured in a shape to cover the opening portion 210. With this structure, it is possible to provide the power conversion device 10 capable of suppressing an increase in the amount of noise propagating from the high-voltage portion to the low-voltage portion such as the first board GND pattern 310 and the mounting region 171 of the first circuit even when the opening portion 210 that avoids the joining portion exists in the metal base plate 200 for maintaining the insulation distance from the joining portion connecting the anode busbar 111 and the cathode busbar 112 with the switching elements 141 to 143 to the metal base plate 200.

With the power conversion device 10 according to the present embodiment, by using the second board GND pattern 320, which is a part of the board pattern, as a shielding plate for electromagnetic noise, it is possible to provide a power conversion device capable of minimizing an additional countermeasure member and suppressing an increase in the amount of noise propagating from the high-voltage portion to the low-voltage portion such as the first board GND pattern 310 and the mounting region 171 of the first circuit at low cost.

Second Embodiment

Figure 5:
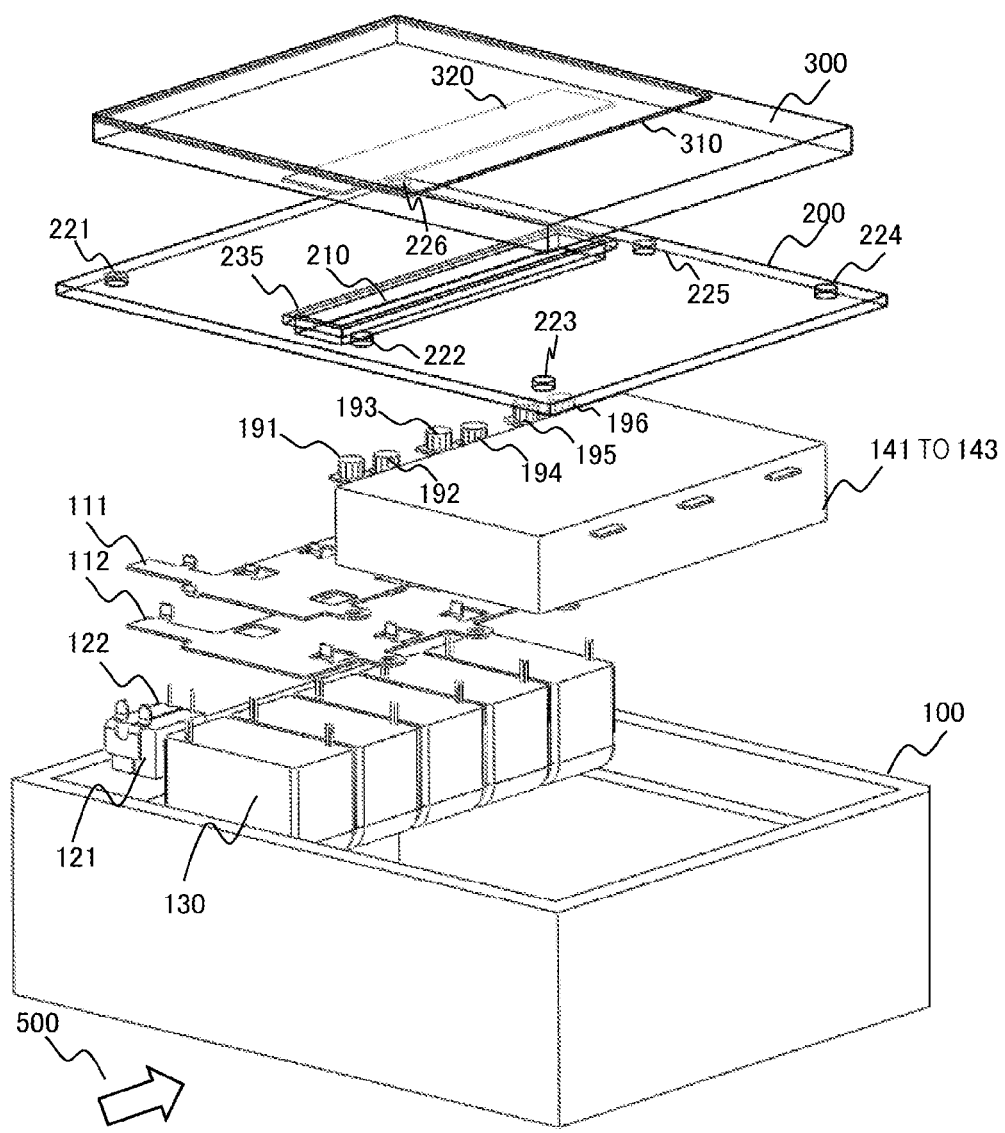
FIG. 5 is an exploded perspective view illustrating an example of a structure of a power conversion device according to a second embodiment.
Figure 6:
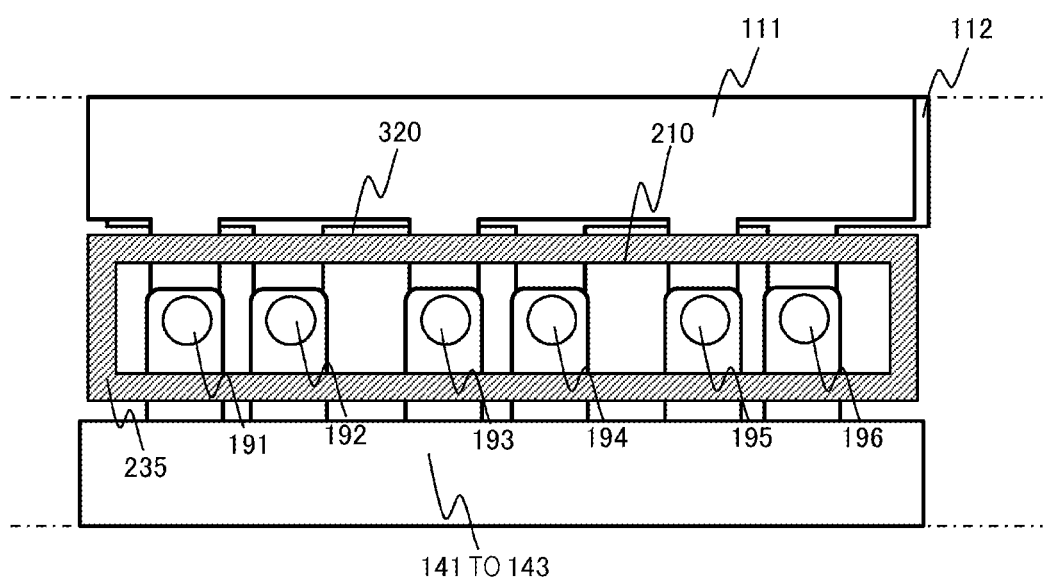
FIG. 6 is a top view illustrating an example of a periphery of an opening portion of a metal base plate of the power conversion device according to the second embodiment.

The second embodiment of the present invention will be described below with reference to FIGS. 5 and 6. Note that the circuit configuration view illustrating the configuration of a power conversion device 10 and the configuration of a motor drive system to which the power conversion device 10 is applied, which is illustrated in FIG. 1 is the same also in the present embodiment. In FIGS. 5 and 6, the same parts as those in FIGS. 1 to 4 are given the same reference numerals, and the explanation thereof will be omitted.

FIG. 5 is an exploded perspective view illustrating an example of the structure of the power conversion device 10 according to the present embodiment. In the figure, the difference from the power conversion device 10 according to the first embodiment illustrated in FIG. 2 is that a second board GND pattern connection wall 235 is formed in place of the second board GND pattern connection bosses 231 to 234.

Similarly to the first embodiment, the metal base plate 200 has the opening portion 210 for avoiding contact with the joining screws 191 to 196, i.e., joining portions, and noise propagates to the low-voltage portion via this opening portion 210. In the periphery of the opening portion 210, a wall (second board GND pattern connection wall 235) for electrically connecting to the circuit board 300 located above the metal base plate 200 is provided, and is electrically connected to the second board GND pattern 320 of the circuit board 300. This electrical connection method is assumed to be, for example, a method of directly bringing the second board GND pattern connection wall 235 into contact without applying a protective film to the second board GND pattern 320, a method of sandwiching a gasket, a method of bringing into contact using a spring, a method of screwing, and the like, but the method is not limited in the present embodiment.

FIG. 6 is a top view illustrating an example of the periphery of the opening portion 210 of the metal base plate 200 of the power conversion device 10 according to the present embodiment. In the figure, the difference from the power conversion device 10 according to the first embodiment illustrated in FIG. 4 is that a second board GND pattern connection wall 235 is formed in place of the second board GND pattern connection bosses 231 to 234.

The positional relationship among the opening portion 210 of the metal base plate 200, the second board GND 320 of the circuit board 300, and the second board GND pattern connection wall 235 will be described in more detail with reference to FIG. 6. First, the opening portion 210 of the metal base plate 200 corresponds to the joining screws 191 to 196 and is for maintaining the insulation distance from the joining screws 191 to 196, and the size of the opening portion 210 is determined according to the insulation distance. The second board GND pattern connection wall 235 is disposed so as to be in contact with the outside of the four corners of the opening portion 210 of the metal base plate 200, and the second board GND pattern 320 is disposed at the equal position and with the equal size to those of a rectangle formed by the second board GND pattern connection wall 235. The second board GND pattern 320 is connected to the metal base plate 200 via the second board GND pattern connection wall 235, and the metal base plate 200 is connected to the housing 100.

In the power conversion device 10 according to the present embodiment, the second board GND pattern 320 is provided to be wider than the size of the opening portion 210 with respect to the opening portion 210 provided in the metal base plate 200, thereby forming the second board GND pattern 320 configured in a shape to cover the opening portion 210 without a gap. With this structure, it is possible to provide the power conversion device 10 capable of suppressing an increase in the amount of noise propagating from the high-voltage portion to the low-voltage portion such as the first board GND pattern 310 and the mounting region 171 of the first circuit even when the opening portion 210 that avoids the joining portion exists in the metal base plate 200 for maintaining the insulation distance from the joining portion connecting the anode busbar 111 and the cathode busbar 112 with the switching elements 141 to 143 to the metal base plate 200.

Third Embodiment

Figure 7:
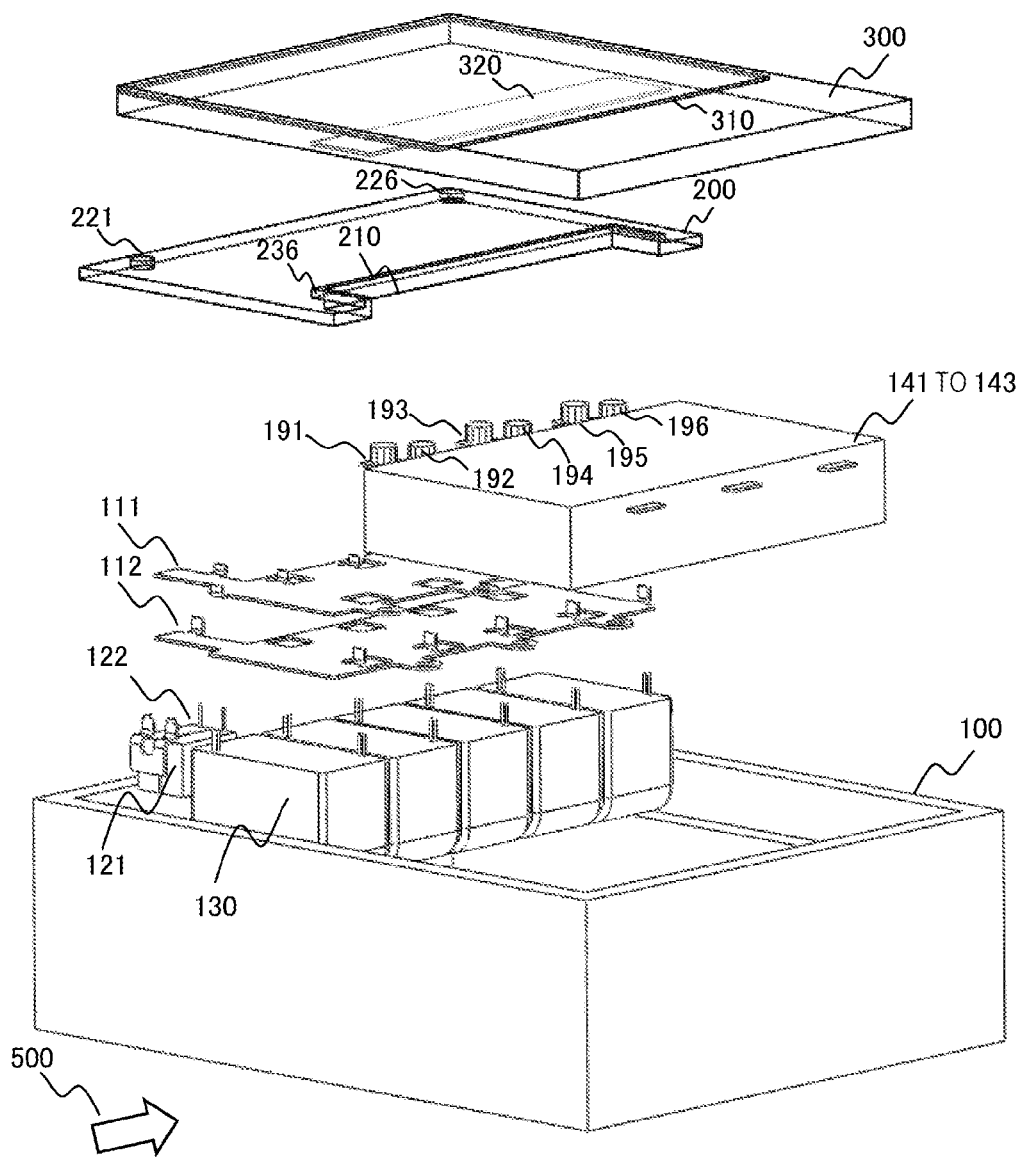
FIG. 7 is an exploded perspective view illustrating an example of a structure of a power conversion device according to a third embodiment.
Figure 8:
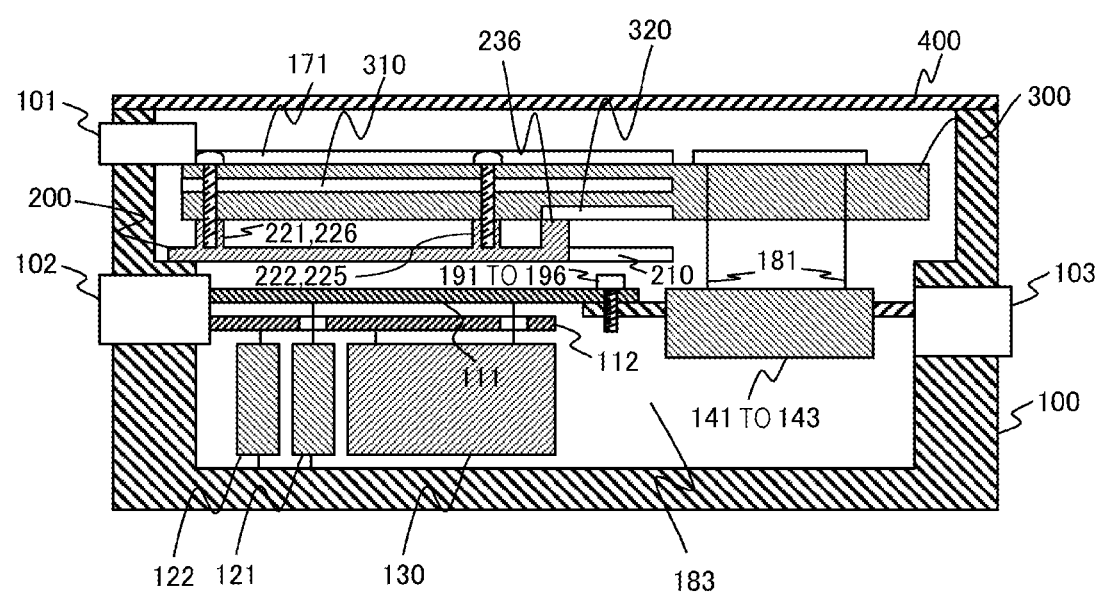
FIG. 8 is a cross-sectional projection view illustrating an example of a structure of the power conversion device according to the third embodiment.
Figure 9:
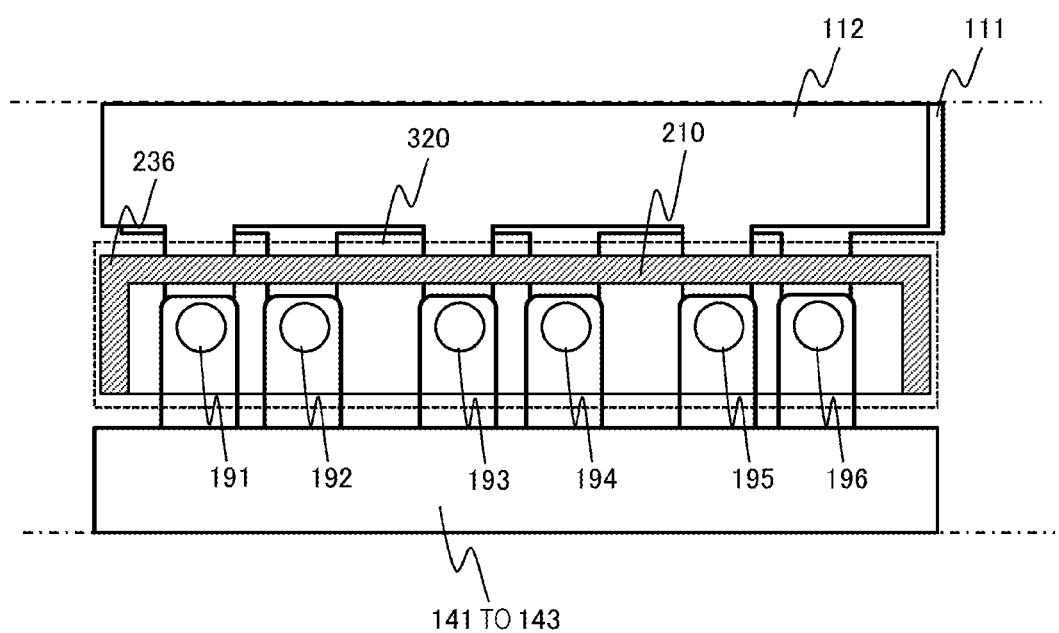
FIG. 9 is a top view illustrating an example of a periphery of an opening portion of a metal base plate of the power conversion device according to the third embodiment.

The third embodiment of the present invention will be described below with reference to FIGS. 7 to 9. Note that the circuit configuration view illustrating the configuration of a power conversion device 10 and the configuration of a motor drive system to which the power conversion device 10 is applied, which is illustrated in FIG. 1 is the same also in the present embodiment. In FIGS. 7 to 9, the same parts as those in FIGS. 1 to 6 are given the same reference numerals, and the explanation thereof will be omitted.

FIG. 7 is an exploded perspective view illustrating an example of the structure of the power conversion device according to the third embodiment of the present invention. In the figure, the difference from the power conversion device 10 according to the second embodiment illustrated in FIG. 5 is a shape in which the metal base plate 200 is present at a position covering at least the anode busbar 111 and the cathode busbar 112, and not present above the switching elements 141 to 143. This shape is assumed to be, for example, a case where the shape of the switching elements 141 to 143 interferes with the metal base plate 200, a case where the number of signal connections between the switching elements 141 to 143 and the circuit board 300 is large, or the like.

Similarly to the first and second embodiments, the metal base plate 200 has the opening portion 210 for avoiding contact with the joining screws 191 to 196, i.e., joining portions, and noise propagates to the low-voltage portion via this opening portion 210. In the periphery of the opening portion 210, a wall (second board GND pattern connection wall 235) for electrically connecting to the circuit board 300 located above the metal base plate 200 is disposed in a U-shape, and is electrically connected to the second board GND pattern 320 of the circuit board 300. This electrical connection method is assumed to be, for example, a method of directly bringing the second board GND pattern connection wall 235 into contact without applying a protective film to the second board GND pattern 320, a method of sandwiching a gasket, a method of bringing into contact using a spring, a method of screwing, and the like, but the method is not limited in the present embodiment.

FIG. 8 is a cross-sectional projection view illustrating an example of the structure of the power conversion device 10 according to the present embodiment. The figure is a cross-sectional projection view when viewed from an arrow 500 illustrated in FIG. 7, which is a view of not a certain straight plane but a projection of a depth direction in order to explain the structure of the power conversion device 10. In the figure, the difference from the power conversion device 10 according to the second embodiment illustrated in FIG. 5 is, as described with reference to FIG. 7, a structure in which the metal base plate 200 is cut to the left end of the switching elements 141 to 143, and a U-shaped second board GND pattern connection wall 236 surrounds the opening portion 210 in a U-shape.

FIG. 9 is a top view illustrating an example of the periphery of the opening portion 210 of the metal base plate 200 of the power conversion device 10 according to the present embodiment. In the figure, the difference from the power conversion device 10 according to the second embodiment illustrated in FIG. 6 is that the U-shaped second board GND pattern connection wall 236 is formed in place of the second board GND pattern connection wall 235 by reducing the metal base plate 200.

The positional relationship among the opening portion 210 of the metal base plate 200, the second board GND pattern 320 of the circuit board 300, and the second board GND pattern connection wall 236 will be described in more detail with reference to FIG. First, the opening portion 210 of the metal base plate 200 corresponds to the joining screws 191 to 196 and is for maintaining the insulation distance from the joining screws 191 to 196, and the size of the opening portion 210 is determined according to the insulation distance. The U-shaped second board GND pattern connection wall 236 is disposed so as to be in contact with the outside of the four corners of the opening portion 210 of the metal base plate 200, and there is no wall on the side on the switching elements 141 to 143 side. The second board GND pattern 320 has an area sufficiently larger than that of a rectangle formed by the second board GND pattern connection wall 236 and the opening portion 210. The second board GND pattern 320 is connected to the metal base plate 200 via the second board GND pattern connection wall 236, and the metal base plate 200 is connected to the housing 100.

In the power conversion device 10 according to the present embodiment, the second board GND pattern 320 is provided to be wide with respect to the opening portion 210 provided in the metal base plate 200, thereby forming the second board GND pattern 320 configured in a shape to cover the opening portion 210. With this structure, it is possible to provide the power conversion device 10 capable of suppressing an increase in the amount of noise propagating from the high-voltage portion to the low-voltage portion such as the first board GND pattern 310 and the mounting region 171 of the first circuit even when the opening portion 210 that avoids the joining portion exists in the metal base plate 200 for maintaining the insulation distance from the joining portion connecting the anode busbar 111 and the cathode busbar 112 with the switching elements 141 to 143 to the metal base plate 200.

In the power conversion device 10 according to the present embodiment, it is possible to provide the power conversion device 10 capable of suppressing an increase in the amount of noise propagating from the high-voltage portion to the low-voltage portion such as the first board GND pattern 310 and the mounting region 171 of the first circuit even if the area of the metal base plate 200 is reduced.

According to the embodiments described above, the following operational effects can be obtained.

(1) The power conversion device 10 includes: the circuit board 300 including the first board GND pattern 310 (the first ground) 310 constituting the ground of the first circuit (the motor control circuit 170) and the second board GND pattern (the second ground) 320 formed to be electrically separated from the first ground 310; the second circuit (the anode busbar 111, the cathode busbar 112, and the switching elements 141 to 143) in which the joining screws (joining portions) 191 to 196 are formed; the metal base plate 200 provided between the second circuit and the circuit board 300 and provided with the opening portion 210 corresponding to the joining portions 191 to 196; and the housing 100 that stores the circuit board 300, the second circuit, and the metal base plate 200 and is electrically connected to the second ground 320 of the circuit board 300 and the metal base plate 200, in which the joining portions 191 to 196 of the second circuit are disposed corresponding to the second ground 320 via the opening portion 210 of the metal base plate 200. This can suppress the influence of noise propagating through the opening portion 210 of the metal base plate 200.

The present invention is not limited to the above embodiments, and other forms conceivable within the scope of the technical idea of the present invention are also included within the scope of the present invention as long as the features of the present invention are not impaired. For example, the above-described embodiments have been explained in detail for easy-to-understand explanation of the present invention, and the present invention is not necessarily limited to those including all the explained configurations. It is possible to replace a part of the configuration of a certain embodiment with that of the configuration of another embodiment, and it is also possible to add the configuration of another embodiment to the configuration of a certain embodiment. The configuration of another embodiment can be added to, deleted from, or replaced with a part of the configuration of each embodiment.

The disclosure of the following priority application is incorporated herein by reference.

Japanese Patent Application 2019-125886 (filed on Jul. 5, 2019)

REFERENCE SIGNS LIST 10 power conversion device
20 low-voltage power supply
30 high-voltage power supply
40 motor
100 housing
101 low-voltage connector
102 high-voltage connector
103 motor harness connector
111 anode busbar
112 cathode busbar
121, 122 Y capacitor
130 X capacitor
141, 142, 143 switching element
151, 152, 153 AC busbar
161, 162, 163 current sensor
170 motor control circuit
171 mounting region of first circuit 180 gate driver circuit
181 gate drive signal
182 AC current monitor signal
183 mounting region of second circuit
191 to 196 joining screw
200 metal base plate
210 opening portion
221 to 226 board fixing boss
231 to 234 second board GND pattern connection boss
235 second board GND pattern connection wall
236 U-shaped second board GND pattern connection wall
300 circuit board
310 first board GND pattern
320 second board GND pattern
400 metal lid

The invention claimed is:

1. A power conversion device, comprising:
a circuit board including a first ground constituting a ground of a first circuit and a second ground formed to be electrically separated from the first ground;
a second circuit in which a joining portion is formed;
a metal base plate provided between the second circuit and the circuit board and provided with an opening portion corresponding to the joining portion; and
a housing that stores the circuit board, the second circuit, and the metal base plate and is electrically connected to the second ground of the circuit board and the metal base plate, wherein
the joining portion of the second circuit is disposed corresponding to the second ground via the opening portion of the metal base plate.

2. The power conversion device according to claim 1, wherein
the joining portion of the second circuit is disposed to face the second ground via the opening portion of the metal base plate.

3. The power conversion device according to claim 1, wherein
the second circuit, a region where the metal base plate is not present, and the second ground are formed so as to at least partially overlap one another when viewed from a direction perpendicular to an implementation surface of the circuit board.

4. The power conversion device according to claim 1, wherein
at least a part of a periphery of the opening portion of the metal base plate is connected to the second ground of the circuit board via a connection member.

5. The power conversion device according to claim 4, wherein
a periphery of the opening portion of the metal base plate is connected to the second ground of the circuit board via the wall-shaped connection member.

6. The power conversion device according to claim 4, wherein
the second ground of the circuit board is connected to the housing through the metal base plate via the connection member.

7. The power conversion device according to claim 1, wherein
the joining portion is a joining part that connects an anode busbar and a cathode busbar with a switching element.

8. The power conversion device according to claim 7, wherein
the first circuit includes a motor control circuit that has a low voltage, and
the second circuit includes an anode busbar, a cathode busbar, and a switching element that have a high voltage.

9. The power conversion device according to claim 7, wherein
the metal base plate is disposed at a position covering at least the anode busbar and the cathode busbar.

* * * * *